(12) United States Patent
Shimada

(10) Patent No.: US 10,063,767 B2
(45) Date of Patent: Aug. 28, 2018

(54) IMAGE PICKUP DEVICE AND IMAGE PICKUP APPARATUS INCLUDING IMAGE PIXELS AND PHASE DIFFERENCE PIXELS HAVING BASIC ARRANGEMENT PATTERN OF FILTERS

(71) Applicant: Olympus Corporation, Hachioji-shi, Tokyo (JP)

(72) Inventor: Yoshinao Shimada, Hino (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 15/625,561

(22) Filed: Jun. 16, 2017

(65) Prior Publication Data

US 2018/0077338 A1 Mar. 15, 2018

(30) Foreign Application Priority Data

Sep. 14, 2016 (JP) .................................. 2016-179354

(51) Int. Cl.
| | |
|---|---|
| *G03B 13/00* | (2006.01) |
| *H04N 5/232* | (2006.01) |
| *H04N 9/04* | (2006.01) |
| *H04N 5/378* | (2011.01) |
| *H04N 5/235* | (2006.01) |
| *H01L 27/146* | (2006.01) |
| *H04N 5/369* | (2011.01) |
| *H04N 9/083* | (2006.01) |

(52) U.S. Cl.
CPC ... *H04N 5/23212* (2013.01); *H01L 27/14605* (2013.01); *H01L 27/14621* (2013.01); *H01L 27/14623* (2013.01); *H01L 27/14645* (2013.01); *H04N 5/2353* (2013.01); *H04N 5/23258* (2013.01); *H04N 5/23287* (2013.01); *H04N 5/3696* (2013.01); *H04N 5/378* (2013.01); *H04N 9/045* (2013.01)

(58) Field of Classification Search
CPC ........ G03B 13/32; G03B 13/34; G03B 13/36; H04N 5/23212; H04N 5/3696; H04N 5/23287; H01L 27/14645; H01L 27/14623; H01L 27/14621; H01L 27/14605
USPC ......... 348/272–273, 280–281, 345, 349–350
See application file for complete search history.

(56) References Cited

U.S. PATENT DOCUMENTS

| | | | |
|---|---|---|---|
| 2014/0092220 A1* | 4/2014 | Kawamura | H04N 9/045 348/49 |
| 2016/0037103 A1* | 2/2016 | Seo | H04N 5/23212 348/302 |

(Continued)

FOREIGN PATENT DOCUMENTS

JP 2014-230020 12/2014

*Primary Examiner* — Ngoc-Yen Vu
(74) *Attorney, Agent, or Firm* — John C. Pokotylo; Pokotylo Patent Services

(57) ABSTRACT

An image pickup device includes a first pixel region including image pixels and phase difference pixels and a second pixel region including image pixels and including no pixel configured to output a valid phase difference pixel signal, wherein a part of the plurality of phase difference pixels in the first pixel region is arranged at a regular position at which a G filter is formed in a Bayer array and another part is arranged at an irregular position at which a filter that is other than the G filter is formed, and a basic arrangement pattern of filters in the second pixel region is equal to a basic arrangement pattern of filters in the first pixel region.

15 Claims, 9 Drawing Sheets

(56) References Cited

U.S. PATENT DOCUMENTS

2017/0094210 A1*   3/2017   Galor Gluskin ..... H04N 5/3696
2017/0170222 A1*   6/2017   Toda ................. H01L 27/14627
2017/0366770 A1*  12/2017   Yokogawa ........... H04N 5/3696

* cited by examiner

FIG. 5

|y\x|0|1|2|3|4|5|6|7|8|9|10|11|12|13|14|15|
|---|---|---|---|---|---|---|---|---|---|---|---|---|---|---|---|---|
|15|Bb|Gb|Bb|Gb|Bb|Gb|Bb|Gb|Bb|Gb|T|Gb|Bb|Gb|B|Gb|
|14|Gr|Rr|Gr|Rr|Gr|Rr|Gr|Rr|Gr|Rr|Gr|Rr|Gr|Rr|Gr|Rr|
|13|Bb|Gb|T|Gb|Bb|Gb|B|Gb|Bb|Gb|Bb|Gb|Bb|Gb|Bb|Gb|
|12|Gr|Rr|L|Rr|Gr|Rr|L|Rr|Gr|Rr|L|Rr|Gr|Rr|L|Rr|
|11|Bb|Gb|Bb|Gb|Bb|Gb|Bb|Gb|Bb|Gb|T|Gb|Bb|Gb|B|Gb|
|10|Gr|Rr|Gr|Rr|Gr|Rr|Gr|Rr|Gr|Rr|Gr|Rr|Gr|Rr|Gr|Rr|
|9|Bb|Gb|T|Gb|Bb|Gb|B|Gb|Bb|Gb|Bb|Gb|Bb|Gb|Bb|Gb|
|8|Gr|Rr|R|Rr|Gr|Rr|R|Rr|Gr|Rr|R|Rr|Gr|Rr|R|Rr|
|7|Bb|Gb|Bb|Gb|Bb|Gb|Bb|Gb|Bb|Gb|T|Gb|Bb|Gb|B|Gb|
|6|Gr|Rr|Gr|Rr|Gr|Rr|Gr|Rr|Gr|Rr|Gr|Rr|Gr|Rr|Gr|Rr|
|5|Bb|Gb|T|Gb|Bb|Gb|B|Gb|Bb|Gb|Bb|Gb|Bb|Gb|Bb|Gb|
|4|L|Rr|Gr|Rr|L|Rr|Gr|Rr|L|Rr|Gr|Rr|L|Rr|Gr|Rr|
|3|Bb|Gb|Bb|Gb|Bb|Gb|Bb|Gb|Bb|Gb|T|Gb|Bb|Gb|B|Gb|
|2|Gr|Rr|Gr|Rr|Gr|Rr|Gr|Rr|Gr|Rr|Gr|Rr|Gr|Rr|Gr|Rr|
|1|Bb|Gb|T|Gb|Bb|Gb|B|Gb|Bb|Gb|Bb|Gb|Bb|Gb|Bb|Gb|
|0|R|Rr|Gr|Rr|R|Rr|Gr|Rr|R|Rr|Gr|Rr|R|Rr|Gr|Rr|

|y\x|0|1|2|3|4|5|6|7|8|9|10|11|12|13|14|15|
|---|---|---|---|---|---|---|---|---|---|---|---|---|---|---|---|---|
|15|Bb|Gb|Bb|Gb|Bb|Gb|Bb|Gb|Bb|Gb|G|Gb|Bb|Gb|G|Gb|
|14|Gr|Rr|Gr|Rr|Gr|Rr|Gr|Rr|Gr|Rr|Gr|Rr|Gr|Rr|Gr|Rr|
|13|Bb|Gb|G|Gb|Bb|Gb|G|Gb|Bb|Gb|Bb|Gb|Bb|Gb|Bb|Gb|
|12|Gr|Rr|G|Rr|Gr|Rr|G|Rr|Gr|Rr|G|Rr|Gr|Rr|G|Rr|
|11|Bb|Gb|Bb|Gb|Bb|Gb|Bb|Gb|Bb|Gb|G|Gb|Bb|Gb|G|Gb|
|10|Gr|Rr|Gr|Rr|Gr|Rr|Gr|Rr|Gr|Rr|Gr|Rr|Gr|Rr|Gr|Rr|
|9|Bb|Gb|G|Gb|Bb|Gb|G|Gb|Bb|Gb|Bb|Gb|Bb|Gb|Bb|Gb|
|8|Gr|Rr|G|Rr|Gr|Rr|G|Rr|Gr|Rr|G|Rr|Gr|Rr|G|Rr|
|7|Bb|Gb|Bb|Gb|Bb|Gb|Bb|Gb|Bb|Gb|G|Gb|Bb|Gb|G|Gb|
|6|Gr|Rr|Gr|Rr|Gr|Rr|Gr|Rr|Gr|Rr|Gr|Rr|Gr|Rr|Gr|Rr|
|5|Bb|Gb|G|Gb|Bb|Gb|G|Gb|Bb|Gb|Bb|Gb|Bb|Gb|Bb|Gb|
|4|G|Rr|Gr|Rr|G|Rr|Gr|Rr|G|Rr|Gr|Rr|G|Rr|Gr|Rr|
|3|Bb|Gb|Bb|Gb|Bb|Gb|Bb|Gb|Bb|Gb|G|Gb|Bb|Gb|G|Gb|
|2|Gr|Rr|Gr|Rr|Gr|Rr|Gr|Rr|Gr|Rr|Gr|Rr|Gr|Rr|Gr|Rr|
|1|Bb|Gb|G|Gb|Bb|Gb|G|Gb|Bb|Gb|Bb|Gb|Bb|Gb|Bb|Gb|
|0|G|Rr|Gr|Rr|G|Rr|Gr|Rr|G|Rr|Gr|Rr|G|Rr|Gr|Rr|

P2

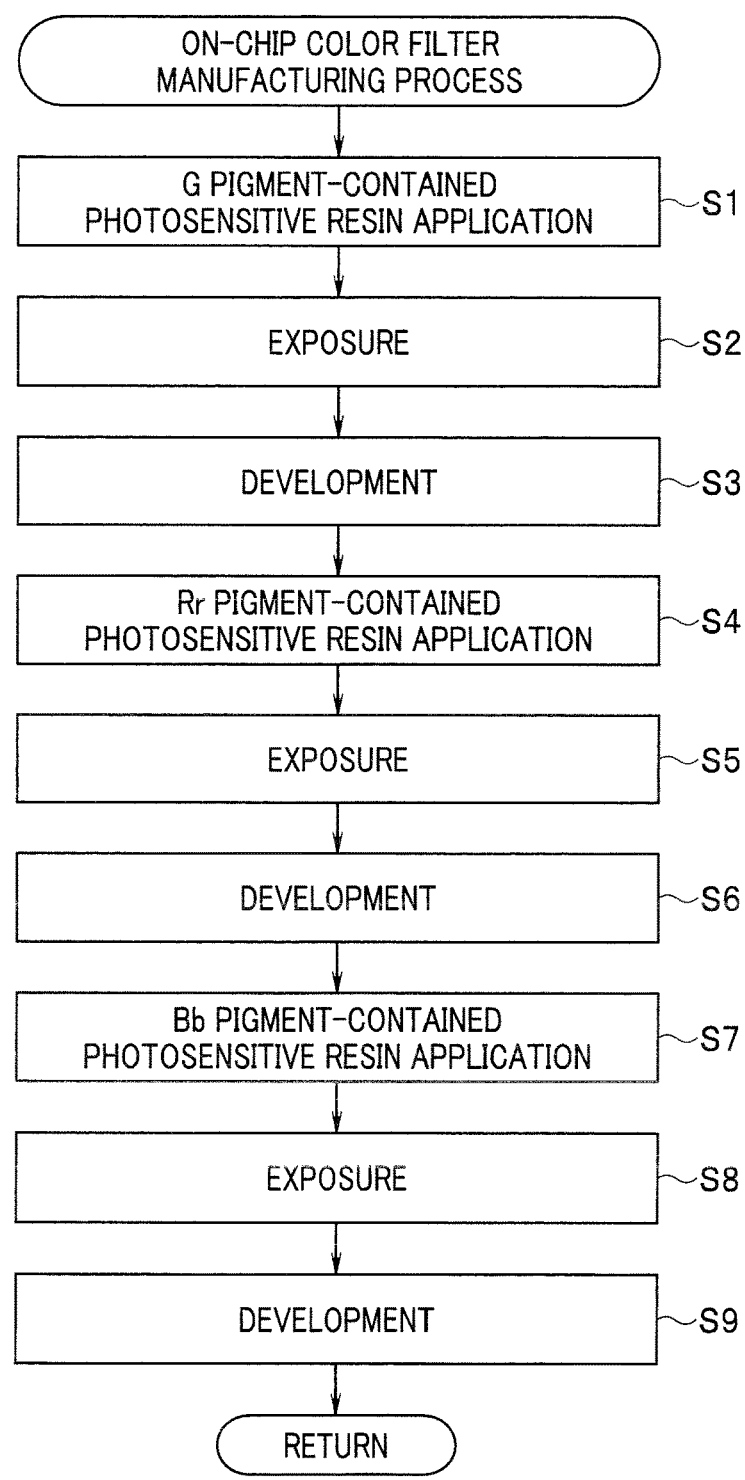

FIG. 8

| | PRESENT EMBODIMENT | | | | | | CONVENTIONAL EXAMPLE | | | | | | |
|---|---|---|---|---|---|---|---|---|---|---|---|---|---|
| | SECOND PIXEL REGION | | FIRST PIXEL REGION | | | | NORMAL REGION | | | PHASE DIFFERENCE PIXEL ARRANGEMENT REGION | | | |
| | Rr | Gr | Bb | T/B | R/L | Rr | Gr | Bb | Rr | Gr | Bb | T/B | R/L | Rr | Gr | Bb |
| AFTER G FILTER FORMATION | | ▨ | | ▨ | ▨ | | ▨ | | | ▨ | | ▨ | ▨ | | ▨ | |
| AFTER Rr FILTER FORMATION | | ▨ | | ▨ | ▨ | ▥ | ▨ | | ▥ | ▨ | | ▨ | ▨ | ▥ | ▨ | |
| AFTER Bb FILTER FORMATION | ▥ | ▨ | ▥ | ▨ | ▨ | ▥ | ▨ | ▥ | ▥ | ▨ | ▥ | ▨ | ▨ | ▥ | ▨ | ▥ |

IMAGE PICKUP DEVICE AND IMAGE PICKUP APPARATUS INCLUDING IMAGE PIXELS AND PHASE DIFFERENCE PIXELS HAVING BASIC ARRANGEMENT PATTERN OF FILTERS

CROSS REFERENCE TO RELATED APPLICATION

This application claims benefit of Japanese Application No. 2016-179354 filed in Japan on Sep. 14, 2016, the entire contents of which are incorporated herein by this reference.

BACKGROUND OF THE INVENTION

1. Field of the Invention

The present invention relates to an image pickup device and an image pickup apparatus that include image pixels and phase difference pixels, in which any of plural types of filters is formed at each pixel position.

2. Description of the Related Art

In recent years, image pickup devices in which phase difference pixels each configured to generate a phase difference pixel signal for focus detection are discretely arranged among two dimensionally-arranged image pixels have been put into practical use and commercialized.

Here, each of the phase difference pixels is formed by light-shielding a part of an opening of a normal image pixel to prohibit entrance of a light ray from a particular direction and allow entrance of a light ray from another particular direction, in order to detect phase difference information.

Such phase difference pixels are arranged in a region called an "AF area".

For example, Japanese Patent Application Laid-Open Publication No. 2014-230020 describes that an image pickup device including color filters in a Bayer array includes a phase difference pixel arrangement region including phase difference pixels and a normal region including no phase difference pixels.

In addition, in recent years, an arrangement region of phase difference pixels tends to be expand to a wider range in an entire image pickup region of an image pickup device in order to perform focus detection in a wider range, and to make a ratio in arrangement of phase difference pixels to image pixels relatively large (increase a density in arrangement of phase difference pixels) (for example, a ratio of one pixel to eight pixels) in order to increase focus detection precision.

However, as stated above, phase difference pixels allow entrance of light in a particular direction and prohibit entrance of light in another particular direction, and thus, even if phase difference pixels are arranged in a peripheral edge portion of an entire image pickup region, for example, a situation in which a light ray enters phase difference pixels, the right side of each pixel being open, but no light ray (or only a smaller amount of light) enters phase difference pixels, the left side of each pixel being open (that is, the right side of each pixel being light-shielded), because of occurrence of vignetting occurs. Focus detection can be performed only if, for example, both pixel signals of phase difference pixels, the right side of each pixel being open, and pixel signals of phase difference pixels, the left side of each pixel being open, are obtained, that is, no valid phase difference pixel signals may be obtained from the peripheral edge portion of the image pickup region. Therefore, even if the arrangement region of the phase difference pixels is expanded, the entire image pickup region is generally separated into the normal region and the phase difference pixel arrangement region mentioned above.

Also, as opposed to normal color pixels, phase difference pixels do not require color component separation, and thus, in order to obtain a highest possible detection sensitivity, a filter configuration that effectively acquires luminance components is employed. In the case of a single-chip image pickup device including color filters arranged in a primitive-color Bayer array, which is widely used in image pickup apparatuses such as digital cameras, a filter of green (G), for example, which is a luminance-equivalent component, is arranged on each phase difference pixel.

However, when a ratio in arrangement of phase difference pixels is increased as mentioned above, arranging all phase difference pixels, for example, at positions of green (G) pixels in a Bayer array causes shortage in number of G pixels for an image, resulting in decrease in image quality.

Therefore, it is conceivable that in consideration of a ratio in number of red (Rr: "Rr" is used for distinction from phase difference pixels R, the right side of each pixel being open) pixels, green (G) pixels and blue (Bb: "Bb" is used for distinction from phase difference pixels B, the bottom side of each pixel being open) pixels for an image, phase difference pixels are arranged at positions other than positions of the G pixels (Rr pixels or Bb pixels) in a Bayer array.

For example, in FIG. 5, which relates to an embodiment of the present invention, phase difference pixels L and R for vertical line detection, the right side or the left side of each pixel being light-shielded, are arranged at positions corresponding to G pixels in a Bayer array, and phase difference pixels B and T for horizontal line detection, the top side or the bottom side of each pixel being light-shielded, are arranged at positions corresponding to blue (Bb) pixels in the Bayer array.

However, even where phase difference pixels are arranged at positions other than positions of G pixels in a Bayer array, providing a red (Rr) filter or a blue (Bb) filter on phase difference pixels is unfavorable from the detection sensitivity perspective mentioned above, and thus, where phase difference pixels are arranged at positions at which an Rr filter or a Bb filter is to be arranged in a Bayer array, a G filter is provided instead of an Rr filter or a Bb filter, and thus, in a phase difference pixel arrangement region including phase difference pixels, a specific filter arrangement pattern that is different from a general Bayer array is employed.

On the other hand, in a normal region including no phase difference pixels, a general Bayer array is employed as it is, and thus, the normal region and the phase difference pixel arrangement region have different filter arrangement patterns. In this case, the following problem occurs.

Here, the problem that occurs will be described with reference to FIGS. 7, 8 and 9 relating to an embodiment of the present invention.

First, a process of forming primitive color filters Rr, G and Bb on an image pickup device is performed, for example, as illustrated in FIG. 7, in the order of a G filter, an Rr filter, a Bb filter.

Here, as indicated in the "conventional example" section in the chart in FIG. 8, first, at the stage of completion of G filter formation, a G filter having a uniform filter thickness is formed in each of a normal region and a phase difference pixel arrangement region.

Next, when an Rr filter is formed, since a ratio of the G filter formed in the phase difference pixel arrangement region is higher than a ratio of the G filter formed in the normal region, upon application of an Rr pigment-contained photosensitive resin to the phase difference pixel arrangement region and the normal region, a filter thickness of Rr pixels in the phase difference pixel region becomes, for example, larger than a filter thickness of Rr pixels in the normal region because of the influence of a difference in G filter density between the phase difference pixel arrangement region and the normal region.

Furthermore, when a Bb filter is formed, since ratios of the G filter and the Rr filter formed in the phase difference pixel arrangement region are higher than ratios of the G filter and the Rr filter formed in the normal region, respectively, upon application of a Bb pigment-contained photosensitive resin to the phase difference pixel arrangement region and the normal region, a filter thickness of Bb pixels in the phase difference pixel region becomes, for example, larger than a filter thickness of Bb pixels in the normal region because of the influence of the difference in G filter density between the phase difference pixel arrangement region and the normal region.

Consequently, in the phase difference pixel arrangement region, the filter thicknesses of the Rr filter and the Bb filter are large in comparison with the normal region. In this case, light transmission is decreased by the amount of the filter thickness increase, and thus, in the phase difference pixel arrangement region, signal values of Gr pixel signals and Gb pixel signals are the same, but signal values of Rr pixel signals and Bb pixel signals become low, in comparison with the normal region. As a result, in the phase difference pixel arrangement region, a luminance is somewhat decreased relative to the normal region, and, for example, a greenish hue is provided (see "hue/luminance disparity" section in the "conventional example" section in FIG. 9).

Therefore, a disparity in hue (and luminance) occurs between the phase difference pixel arrangement region and the normal region.

Furthermore, an image pixel signal at a pixel position of each phase difference pixel is obtained by interpolation from image pixel signals of image pixels adjacent to the phase difference pixel, the image pixels including a color filter of a color that is the same as a color of a color filter in a Bayer array at the pixel position of the phase difference pixel. At this time, the interpolated pixel signal is obtained by arithmetic averaging of the plurality of pixels (e.g., weighted averaging according to characteristics of the shot image), but since arithmetic averaging processing simply corresponds to flattening processing, as indicated in the "noisiness" section in the "conventional example" section in FIG. 9, a noise amount of random noise such as dark-current shot noise generated in photodiodes, optical shot noise and reset noise of a reading circuit is smaller in the phase difference pixel arrangement region in which image pixel signals at pixel positions of the phase difference pixels are obtained by interpolation, than in the normal region, that is, the normal region and the phase difference pixel arrangement region are different from each other in noisiness.

SUMMARY OF THE INVENTION

An image pickup device according to an aspect of the present invention includes a plurality of pixels arranged in two dimensions, one type of filter from among plural types of filters having different spectral characteristics being formed on each of the plurality of pixels, the image pickup device including: a first pixel region including a plurality of image pixels each configured to generate and output an image pixel signal, and a plurality of phase difference pixels each configured to generate and output a phase difference pixel signal; and a second pixel region including a plurality of image pixels each configured to generate and output an image pixel signal and including no pixel configured to output a valid phase difference pixel signal, and the plural types of filters are arranged on the plurality of image pixels in the first pixel region according to a predetermined arrangement pattern, for the plurality of phase difference pixels, a first type of filter from among the plural types of filters is formed on each of the phase difference pixels, and a part of the plurality of phase difference pixels is arranged at a regular position that is a position at which the first type of filter is formed where the predetermined arrangement pattern is applied to positions of the phase difference pixels and another part of the plurality of phase difference pixels is arranged at an irregular position that is a position at which a type of filter that is different from the first type of filter is formed, and a basic arrangement pattern of filters in the second pixel region is equal to a basic arrangement pattern of filters in the first pixel region.

An image pickup apparatus according to another aspect of the present invention includes: the image pickup device; and a focus detection signal processing circuit configured to perform focus detection based on the phase difference pixel signals outputted from the image pickup device, and the second pixel region in the image pickup device includes the plurality of image pixels, and further includes a plurality of phase difference pixels each configured to generate and output an invalid phase difference pixel signal, and the focus detection signal processing circuit performs focus detection using only the phase difference pixel signals from the first pixel region, without using the invalid phase difference pixel signals from the second pixel region.

BRIEF DESCRIPTION OF THE DRAWINGS

FIG. 5 is a diagram illustrating a pixel configuration in a first pixel region and a basic arrangement pattern P1 of filters formed on pixels in Embodiment 1;

FIG. 6 is a diagram illustrating a pixel configuration in a second pixel region and a basic arrangement pattern P2 of filters formed on pixels in Embodiment 1;

FIG. 7 is a flowchart indicating an on-chip color filter manufacturing process for the image pickup device according to Embodiment 1;

FIG. 8 is a chart illustrating a thickness of each color filter formed in the on-chip color filter manufacturing process in FIG. 7, with comparison between Embodiment 1 and a conventional example;

DETAILED DESCRIPTION OF THE PREFERRED EMBODIMENT

An embodiment of the present invention will be described below with reference to the drawings.

Embodiment 1

Figure 1:
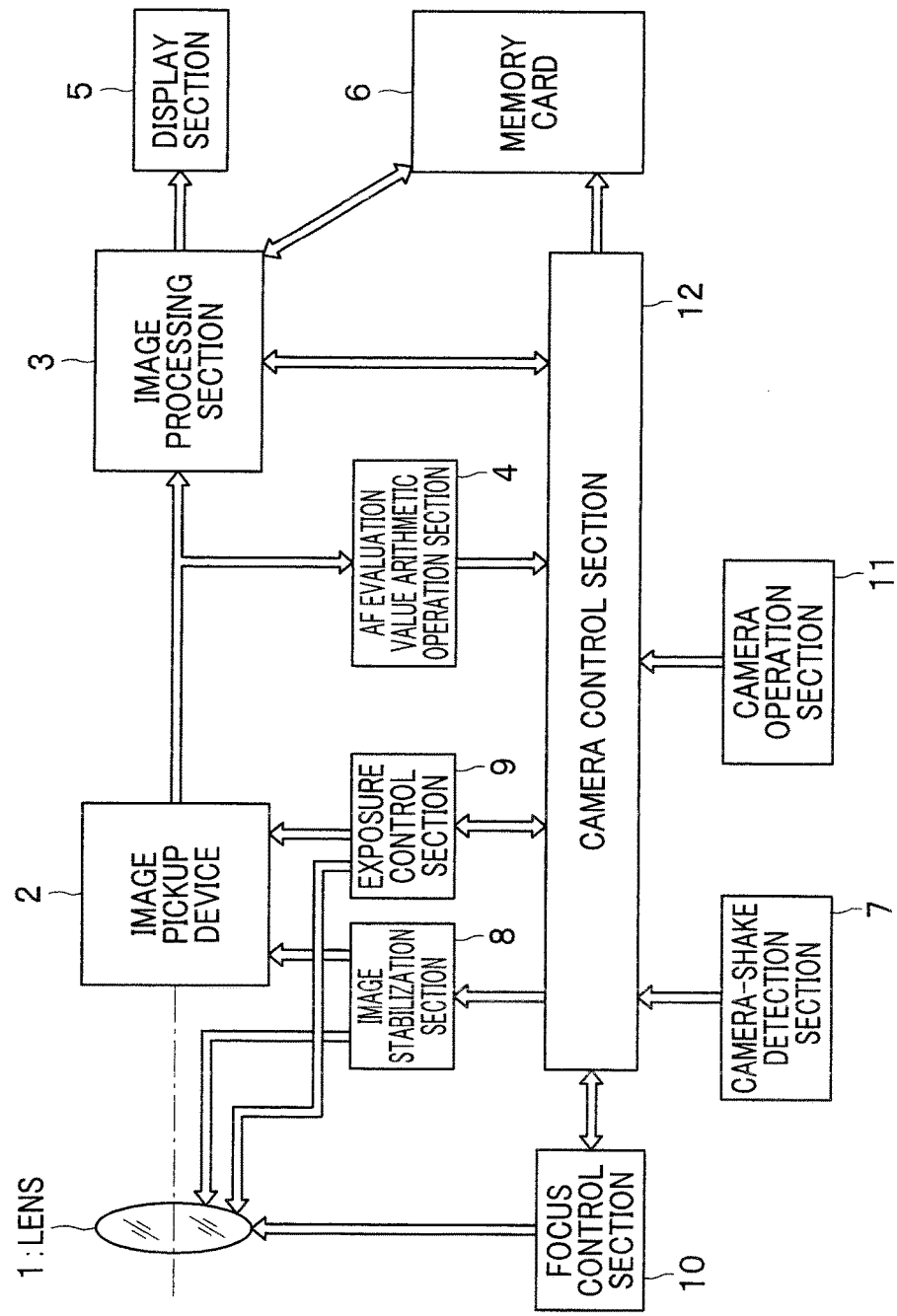
FIG. 1 is a block diagram illustrating a configuration of an image pickup apparatus according to Embodiment 1 of the present invention.

FIGS. 1 to 12 indicate Embodiment 1 of the present invention, and FIG. 1 is a block diagram illustrating a configuration of an image pickup apparatus. Note that, although FIG. 1 indicates an example in which the image pickup apparatus is configured, for example, as a digital camera, the image pickup apparatus is not limited to a digital camera, and may be applied widely to any of various types of apparatus having a shooting function such as a digital video camera and a telephone apparatus with a shooting function.

As illustrated in FIG. 1, the image pickup apparatus includes a lens 1, an image pickup device 2, an image processing section 3, an AF (automatic focus) evaluation value arithmetic operation section 4, a display section 5, a camera-shake detection section 7, an image stabilization section 8, an exposure control section 9, a focus control section 10, a camera operation section 11 and a camera control section 12. Here, although a memory card 6 is illustrated in FIG. 1, the memory card 6 is configured so as to be detachable from the image pickup apparatus, and thus, may be a component that is not specific to the image pickup apparatus.

The lens 1 is an image pickup optical system configured to form an optical image of an object on an image pickup region of the image pickup device 2. The lens 1 includes a focus lens for adjusting a focal position for focusing and an aperture for controlling a range of a light flux passing through the lens 1, and further has an image stabilization function in the present embodiment.

The image pickup device 2 photoelectrically converts the optical image of the object formed by the lens 1 and outputs the optical image as an image signal. As described later, the image pickup device 2 includes image pixels for forming an image signal and further includes phase difference pixels for focus detection. Also, in the present embodiment, the image pickup device 2 is configured so as to be movable in a plane perpendicular to a shooting optical axis of the lens 1, and thus has an image stabilization function. Also, the image pickup device 2 can perform mix reading in which a plurality of pixel signals relating to a same type of filter are subjected to pixel mixing processing (mix processing) and read.

The image processing section 3 is intended to perform various types of image processing on an image signal configured based on image pixel signals outputted from the image pixels in the image pickup device 2 to generate an image signal for display or recording.

The AF evaluation value arithmetic operation section 4 is intended to calculate an AF evaluation value indicating a focusing state based on pixel signals outputted from the image pickup device 2 and output the AF evaluation value to the camera control section 12. More specifically, the AF evaluation value arithmetic operation section 4 is configured to calculate a phase difference based on phase difference pixel signals read from the phase difference pixels in the image pickup device 2 and output the phase difference as an AF evaluation value. Here, the AF evaluation value arithmetic operation section 4 may be configured to further calculate a contrast value based on the image signals outputted from the image pickup device 2 and output the contrast value as an AF evaluation value (that is, may further perform contrast AF in addition to phase difference AF).

The display section 5 is intended to display an image based on the signal subjected to image processing for display by the image processing section 3. The display section 5 is configured to provide, e.g., live view display, display of a still image immediately after shooting, reproduction display of a recorded still image, display of a movie that is being recorded and reproduction display of a movie and also display, e.g., various types of information relating to the image pickup apparatus. Also, during live view or movie recording, in order to secure a frame rate, for example, the aforementioned mix reading is performed.

The memory card 6 is a recording medium for storing the signal subjected to image processing for recording by the image processing section 3 (e.g., a still image signal or a movie image signal).

The camera-shake detection section 7 includes, e.g., an acceleration sensor and/or an angular velocity sensor, and is intended to detect camera-shake of the image pickup apparatus and output the detected information to the camera control section 12.

The image stabilization section 8 is intended to move at least one of the lens 1 and the image pickup device 2 based on control performed by the camera control section 12 so as to cancel out the detected camera-shake to reduce an effect of the camera-shake on the optical object image formed on the image pickup region of the image pickup device 2.

The exposure control section 9 is intended to control a device shutter of the image pickup device 2 based on a shutter speed (exposure time period) determined by the camera control section 12, under the control of the camera control section 12, to cause the image pickup device 2 to acquire an image. Furthermore, the exposure control section 9 is configured to also perform, e.g., control of the aperture included in the lens 1 based on an aperture value determined by the camera control section 12. Here, the shutter speed and the aperture value are determined by the camera control section 12 based on, e.g., for example, a program chart according to an APEX system, using, e.g., light measurement data calculated based on the image signal outputted from the image pickup device 2 and an ISO sensitivity set by the camera operation section 11 (or automatically set by the camera control section 12). Also, the exposure control section 9 is configured so as to output drive information for the image pickup device 2 to the camera control section 12.

The focus control section 10 is intended to drive the lens 1 in order to adjust the focal position. In other words, the focus control section 10 is intended to drive the focus lens included in the lens 1 based on the control performed by the camera control section 12 that has received the AF evaluation value from the AF evaluation value arithmetic operation section 4 so as to bring the object image formed on the image pickup device 2 into focus. Also, the focus control section 10 is configured so as to output lens drive information such as a lens position to the camera control section 12.

As described above, the AF evaluation value arithmetic operation section 4, the camera control section 12 and the focus control section 10 configure a focus detection signal processing circuit configured to perform focus detection based on phase difference pixel signals outputted from the image pickup device 2.

The camera operation section 11 is an operation section for performing various operation inputs to the image pickup apparatus. The camera operation section 11 includes operation members such as a power supply switch for turning on/off the image pickup apparatus, a release button for an instruction input for, e.g., still image shooting or movie shooting and a mode button for setting, e.g., a still image shooting mode, a movie shooting mode, a live view mode or a still image/movie reproduction mode.

The camera control section 12 is intended to control the entire image pickup apparatus including the image processing section 3, the memory card 6, the image stabilization section 8, the exposure control section 9, the focus control section 10, etc., based on, e.g., the lens drive information from the focus control section 10, the AF evaluation value from the AF evaluation value arithmetic operation section 4, the drive information for the image pickup device 2 from the exposure control section 9, processing information from the image processing section 3, the camera-shake information from the camera-shake detection section 7, and the operation inputs from the camera operation section 11.

Figure 2:
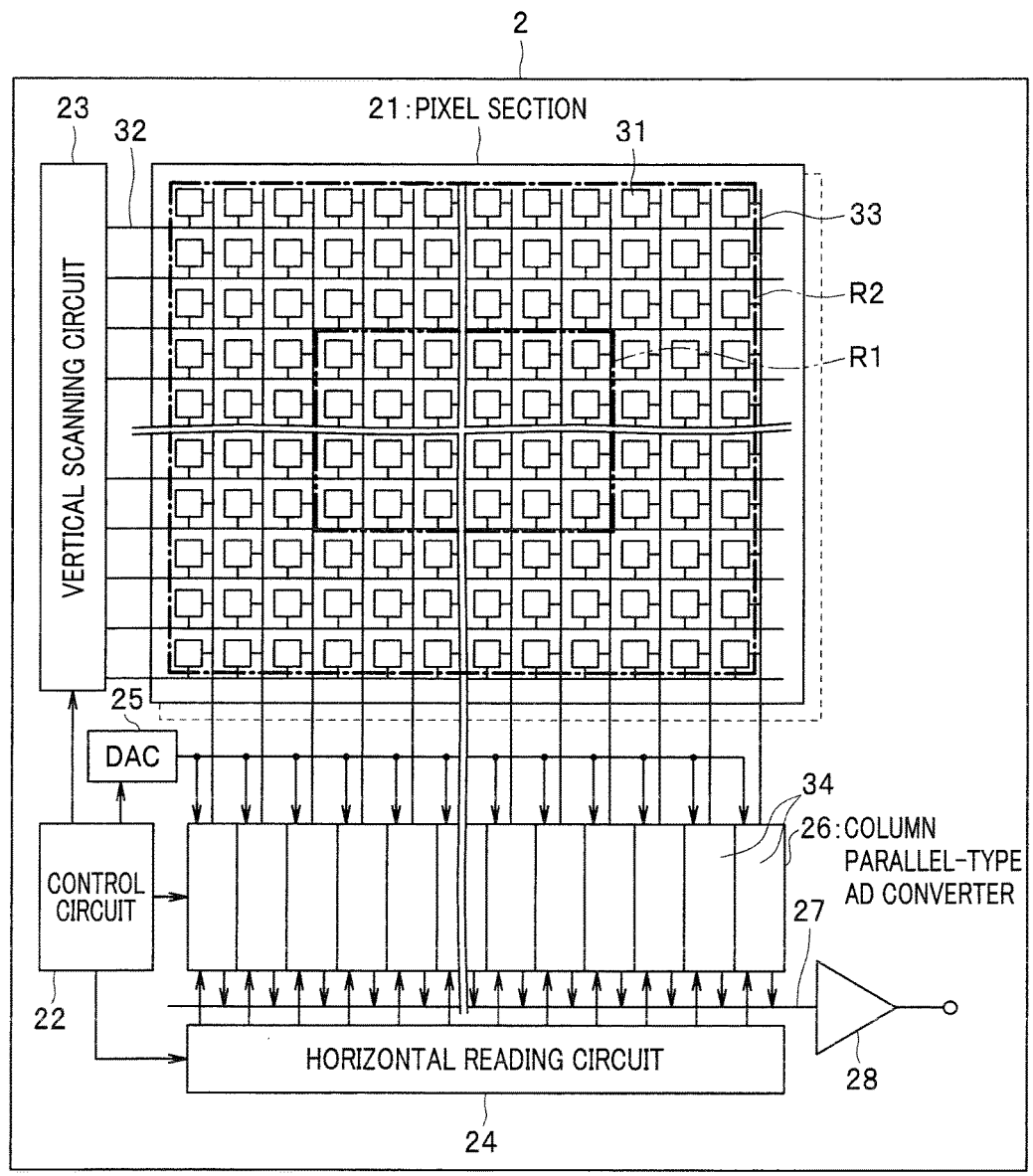
FIG. 2 is a diagram illustrating an overview of a configuration of an image pickup device according to Embodiment 1.

Next, FIG. 2 is a diagram illustrating an overview of a configuration of the image pickup device 2. Note that arrangement of each circuit element illustrated in FIG. 2 is illustrated in a conceptualized manner as appropriate and does not necessarily correspond to actual arrangement.

The image pickup device 2 includes a pixel section 21. Also, the image pickup device 2 includes a control circuit 22, a vertical scanning circuit 23, a horizontal reading circuit 24 and a DAC (digital-analog converter) 25, as a device control section. Furthermore, the image pickup device 2 includes a column parallel-type AD converter 26, a horizontal signal line 27 and a sense amplifier circuit 28, as an image signal output section.

First, the pixel section 21 is an image pickup region in which a plurality of pixels 31 each configured to generate signal charge according to an exposure amount are arranged in two dimensions, and more specifically, as the two dimensional arrangement, for example, a matrix array is employed. Then, an array in a row direction of pixels 31 in the pixel section 21 is called a "row" or a "line" and an array in a column direction of pixels 31 in the pixel section 21 is called a "column". Also, the row direction is called, e.g., a "horizontal direction" and the column direction is called, e.g., a "vertical direction".

A control signal line 32 is connected to each row of the pixels 31 arrayed in the pixel section 21 and a vertical signal line 33 is connected to each column of the pixels 31 arrayed in the pixel section 21.

In the pixel section 21, for example, a first pixel region R1 is provided in a center portion, and a second pixel region R2 is further provided on the outer peripheral side of the first pixel region R1.

The first pixel region R1 includes a plurality of image pixels each configured to generate and output an image pixel signal, and a plurality of phase difference pixels each configured to generate and output a phase difference pixel signal.

Also, the second pixel region R2 includes a plurality of image pixels each configured to generate and output an image pixel signal and includes no pixel configured to output a valid phase difference pixel signal. Here, as described in detail later, the inclusion of no pixel configured to output a valid phase difference pixel signal means either no phase difference pixel signal itself being outputted because of provision of no phase difference pixel in the second pixel region R2 or phase difference pixels being provided in the second pixel region R2 but a signal generated by each phase difference pixel in the second pixel region R2 being a signal that is improper for use for focus detection (invalid phase difference pixel signal).

The vertical scanning circuit 23 is configured by, e.g., a shift register, and the control signal lines 32 in the respective rows are connected to the vertical scanning circuit 23, and the vertical scanning circuit 23 is configured so as to be able to output a control signal to the pixel section 21 individually on a row-by-row basis.

The column parallel-type AD converter 26 includes a plurality of ADC (analog-digital converters) 34 connected to the plurality of vertical signal lines 33, respectively. Since all of the ADCs 34 can operate simultaneously, analog signals simultaneously transmitted via an arbitrary number of vertical signal lines 33 are simultaneously converted into digital signals. Then, the column parallel-type AD converter 26 performs signal processing, for example, such as denoising and/or amplification, on the pixel signals outputted column by column from the pixels 31 via the vertical signal lines 33 and further performs processing for converting the analog pixel signals into digital signals.

The DAC 25 is intended to convert a digital signal (count signal) outputted by the control circuit 22 in order to control the column parallel-type AD converter 26, into an analog signal (ramp voltage signal, a voltage value of which varies at a constant gradient relative to time).

The horizontal reading circuit 24 is configured by, for example, a shift register, and is intended to sequentially select ADCs 34 in the column parallel-type AD converter 26, the ADCs 34 relating to pixel columns from which pixel signals are to be read, and sequentially output the pixel signals from the column parallel-type AD converter 26 to the horizontal signal line 27 to read the pixel signals.

Also, for example, the control circuit 22, the vertical scanning circuit 23, the horizontal reading circuit 24 and the column parallel-type AD converter 26 configure a pixel-mixed reading circuit by including an arbitrary configuration (for example, a configuration including, e.g., a buffer and/or an adder circuit). Here, the pixel-mixed reading circuit is intended to generate and read out a mixed pixel signal resulting from mixing pixel signals from a plurality of adjacent pixels on which a same type of filter is formed. Note that, although the configuration in which the control circuit 22, the vertical scanning circuit 23, the horizontal reading circuit 24 and the column parallel-type AD converter 26 double as the pixel-mixed reading circuit is provided here, it should be understood that a dedicated pixel-mixed reading circuit may separately be provided.

The sense amplifier circuit 28 is intended to perform signal processing, such as amplification, on the pixel signals outputted to the horizontal signal line 27.

The control circuit 22 is a control section configured to generate a clock signal, which serves as a reference of operation, and control signals such as a vertical synchronization signal VD (see FIG. 12) and a horizontal synchronization signal HD (see FIG. 12) based on control performed by the exposure control section 9 to control, e.g., the vertical scanning circuit 23, the horizontal reading circuit 24, the DAC 25 and the column parallel-type AD converter 26 described above.

Figure 3:
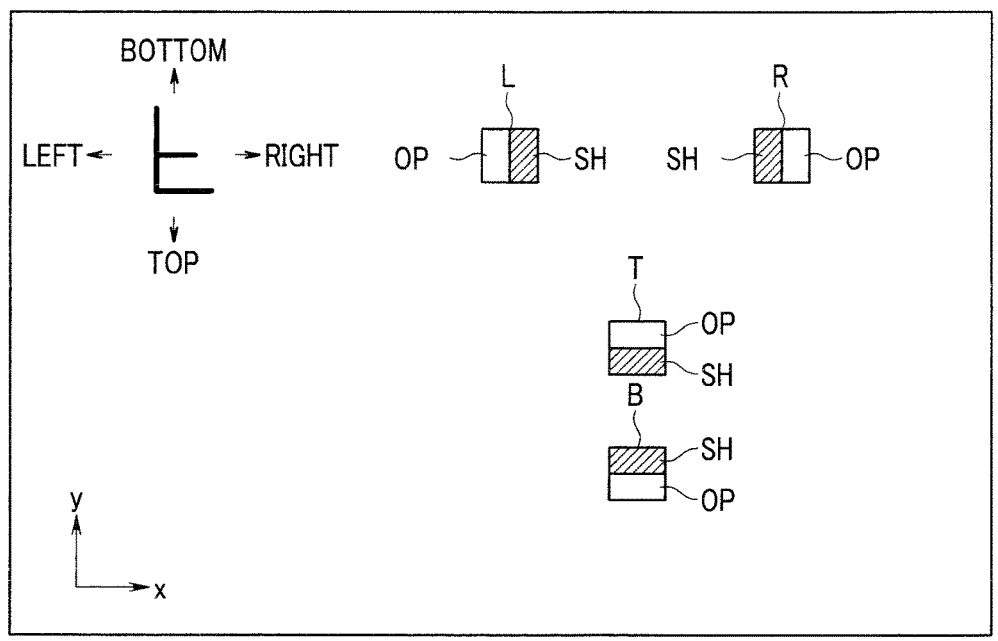
FIG. 3 is a diagram illustrating examples of configurations of phase difference pixels in the image pickup device according to Embodiment 1.

Next, FIG. 3 is a diagram illustrating examples of configurations of phase difference pixels in the image pickup device 2. Here, FIG. 3 illustrates pixels as the pixel section 21 is viewed from the front, and where the letter "F" viewed from the lens 1 is an object, an optical image of the letter "F" is inverted by the lens 1 and formed in top/bottom and right/left directions such as illustrated in FIG. 3. Also, the x direction in FIG. 3 is a horizontal direction, and the y direction is a vertical direction.

In the image pickup device 2 according to the present embodiment, phase difference pixels for vertical line detection and phase difference pixels for horizontal line detection are provided in the pixel section 21.

Here, the group of phase difference pixels for vertical line detection includes a group of phase difference pixels L, the right side of each pixel being light-shielded by a light-shielding portion SH, the left side of each pixel including an opening portion OP, and a group of phase difference pixels R, the left side of each pixel being light-shielded by a light-shielding portion SH, the right side of each pixel including an opening portion OP, the phase difference pixels L and the phase difference pixels R being paired. Then, a difference between an image-forming position in the horizontal direction of a vertical line obtained from pixel signals from the group of phase difference pixels L and an image-forming position in the horizontal direction of the vertical line obtained from pixel signals from the group of phase difference pixels R is detected as a phase difference.

Also, the group of phase difference pixels for horizontal line detection includes a group of phase difference pixels B, the top side of each pixel being light-shielded by a light-shielding portion SH, the bottom side of each pixel including an opening portion OP, and a group of phase difference pixels T, the bottom side of each pixel being light-shielded by a light-shielding portion SH, the top side of each pixel including an opening portion OP, the phase difference pixels B and the phase difference pixels T being paired. Then, a difference between an image-forming position in the vertical direction of a horizontal line obtained from pixel signals from the group of phase difference pixels B and an image formation position in the vertical direction of the horizontal line obtained from pixel signals from the group of phase difference pixels T is detected as a phase difference.

Figure 4:
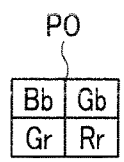
FIG. 4 is a diagram illustrating a Bayer array as a predetermined arrangement pattern P0 of filters for image pixels in Embodiment 1.

FIG. 4 is a diagram illustrating a Bayer array as a predetermined arrangement pattern P0 of filters on image pixels.

In the image pickup device 2 according to the present embodiment, any one type of filter from among plural types of filters having different spectral characteristics is formed on each of the plurality of pixels 31 arranged in two dimensions. Here, the plural types of filters having different spectral characteristics in the present embodiment are three types of color filters, a red (Rr) filter, a green (G) filter and a blue (Bb) filter. However, the filters are not limited to the three types of color filters and may include more types of color filters, and may include filters that are not color filters. For example, as the types of filters having different spectral characteristics, various types of filters such as a transparent (W) filter, an infrared transmitting (IR) filter may be included.

Then, on the plurality of pixels 31 arrayed in the image pickup device 2 according to the present embodiment, basically, filters of a primitive-color Bayer array are arranged; however, as described later with reference to FIGS. 5 and 6, a filter that is an exception in the primitive-color Bayer array is formed on each of several pixels 31.

As well known, a primitive-color Bayer array has a 2×2 pixel array-based configuration in which a green (G) filter is arranged at two diagonal positions in the 2×2 pixel array, and a red (Rr) filter is arranged at one of the remaining diagonal positions and a blue (Bb) filter is arranged at the other.

Then, a pixel on which a red (Rr) filter is formed is referred to as "Rr pixel", a pixel on which a blue (Bb) filter is formed is referred to as "Bb pixel", a pixel on which a green (G) filter is formed, the pixel being arrayed on a same row as an Rr pixel, is referred to as "Gr pixel" and a pixel on which a green (G) filter is formed, the pixel being arranged on a same row as a Bb pixel, is referred to as "Gb pixel". As described above, "Rr pixel" is provided for distinction from a phase difference pixel R, the right side of which is open, and "Bb pixel" is provided for distinction from a phase difference pixel B, the bottom side of which is open. Also, "Gr pixel" and "Gb pixel" are provided for distinction between the pixels in terms of whether the pixel is provided on a same row as an Rr pixel or a Bb pixel.

In the present embodiment, the filter arrangement pattern such as illustrated in FIG. 4 is a predetermined arrangement pattern P0. However, the predetermined arrangement pattern P0 is not limited to the arrangement pattern such as illustrated in FIG. 4 and may be a complementary color-based arrangement pattern, or in terms of the array, another array may be employed.

FIG. 5 is a diagram illustrating a pixel configuration and a basic arrangement pattern P1 of filters formed on pixels in the first pixel region R1. Note that, in FIG. 5 (and FIGS. 6, 10 and 11 described later), relative addresses in an x direction and a y direction for indicating pixel positions are indicated at the bottom and the left of the pixel array.

The first pixel region R1 is configured by covering the region using the basic arrangement pattern P1 illustrated in FIG. 5 with no gap.

Here, a basic arrangement pattern is an arrangement pattern that enables configuration of a filter pattern in an entire region when the region is covered using the basic arrangement pattern with no gap, and is a minimum arrangement pattern, and thus, no arrangement pattern that is smaller than the basic arrangement pattern exists.

First, the plural types of filters are arranged on the plurality of image pixels Bb, Gb, Gr and Rr in the first pixel region R1 according to the predetermined arrangement pattern P0 illustrated in FIG. 4.

On the other hand, a G filter, which is a first type of filter from among the plural types of filters, is formed on all of the plurality of phase difference pixels R, L, T and B in the first pixel region R1.

Here, it is assumed that where the predetermined arrangement pattern P0 is applied to positions of the phase difference pixels, a position at which the first type of filter (here, the G filter) is formed is referred to as "regular position" and a position at which a type of filter that is different from the first type of filter (the G filter as above) is formed is referred to as "irregular position".

In this case, a part of the plurality of phase difference pixels is arranged at regular positions, and another part of the plurality of phase difference pixels is arranged at irregular positions. For example, either one of the phase difference pixels for vertical line detection and the phase difference pixels for horizontal line detection are all arranged at regular positions and the other of the phase difference pixels for the vertical line detection and the phase difference pixels for the horizontal line detection are all arranged at irregular positions.

More specifically, in the example illustrated in FIG. 5, from among the phase difference pixels R, L, T and B, the phase difference pixels R and L for vertical line detection are all arranged at positions corresponding to Gr pixels, that is, regular positions, and the phase difference pixels T and B for horizontal line detection are all arranged at positions corresponding to Bb pixels, that is, irregular positions.

Next, FIG. 6 is a diagram illustrating a pixel configuration and a basic arrangement pattern P2 of filters formed on pixels in the second pixel region R2.

The basic arrangement pattern P2 of filters in the second pixel region R2 is configured to so as to be equal to the basic arrangement pattern P1 of filters in the first pixel region R1.

However, even if the filter arrangement is the same, the second pixel region R2 includes no phase difference pixel including a light-shielding portion SH, and thus, at the positions corresponding to the phase difference pixels R, L, T and B in the pixel arrangement in the first pixel region R1 illustrated in FIG. 5, green (G) pixels are provided in the pixel arrangement of the second pixel region R2 illustrated in FIG. 6. Note that the green pixels arranged at positions corresponding to the phase difference pixels R, L, T and B are indicated as G pixels in FIG. 6 and FIG. 11 described later regardless of whether the green pixels are on a same line as Rr pixels or Bb pixels.

As described above, in the example illustrated in FIG. 6, no phase difference pixel is included in the second pixel region R2, and naturally, the second pixel region R2 includes no pixel configured to output a valid phase difference pixel signal.

However, even if the pixel configuration of the second pixel region R2 is made to the same as the pixel configuration of the first pixel region R1 illustrated in FIG. 5 so as to make phase difference pixels be included in the second pixel region R2, the second pixel region R2 is regarded as outputting no valid phase difference pixel signal because of the following reason.

In other words, the phase difference pixels each have a structure that allows entrance of light in a particular direction and prohibits entrance of light in another particular direction by means of provision of a light-shielding portion SH. Thus, even if phase difference pixels are arranged in the second pixel region R2 provided in a peripheral edge portion of the pixel section 21, for example, a situation in which a light ray enters the phase difference pixels R but no light ray (or only a small amount of light) enters the phase difference pixels L because of occurrence of vignetting occurs. In this case, in the second pixel region R2, phase difference detection cannot be performed using the group of phase difference pixels R and the group of phase difference pixels L as a pair, and thus, the second pixel region R2 is regarded as outputting no valid phase difference pixel signal.

In other words, when phase difference pixels are provided in the entire pixel section 21, the first pixel region R1 is a maximum region that enables provision of valid phase difference pixel signals and the second pixel region R2 is a region that enables provision of no valid phase difference pixel signal. Consequently, a largest possible phase difference detection-enabled region (a so-called AF area) can be secured.

As described above, the second pixel region R2 may include a plurality of phase difference pixels each configured to generate an invalid phase difference pixel signal in addition to the plurality of image pixels. In this case, the AF evaluation value arithmetic operation section 4, the camera control section 12 and the focus control section 10 included in the focus detection signal processing circuit perform focus detection not using invalid phase difference pixel signals from the second pixel region R2, but using phase difference pixel signals from the first pixel region R1 only.

Here, in the examples illustrated in FIGS. 5 and 6, the basic arrangement pattern P2 of filters in the second pixel region R2 is equal to the basic arrangement pattern P1 of filters in the first pixel region R1, but a certain degree of disparity correction effect (see, e.g., FIG. 9 described later) can be provided by just making ratios of respective types of filters in the second pixel region R2 equal to ratios of respective types of filters in the first pixel region R1.

FIG. 7 is a flowchart indicating an on-chip color filter manufacturing process for the image pickup device 2, and FIG. 8 is a chart illustrating a thickness of each color filter formed in the on-chip color filter manufacturing process in FIG. 7, with comparison between the present embodiment 1 and a conventional example.

The on-chip color filter manufacturing process indicated in FIG. 7 is performed as a part of a process of manufacturing the image pickup device 2, and is performed on a wafer for which a diffusion process for forming pixels 31 in the image pickup device 2 and the respective circuits, etc., illustrated in FIG. 2 has been completed.

Upon start of the processing indicated in FIG. 7, first, G pigment-contained photosensitive resin (photoresist) is applied to entire surfaces of pixel sections 21 (step S1).

Then, a photomask for a G filter is put on pixel sections 21 and the pixel sections 21 are subjected to an exposure for applying light such as an ultraviolet ray to transfer a pattern of the photomask to the pixel sections 21 (step S2).

Subsequently, the wafer is immersed in a developer for development to remove unnecessary photoresist parts, and then is washed with pure water, and a filter pattern of a G filter alone is thus formed (step S3).

At this time, as indicated in the "after G filter formation" section in the "present embodiment" section of the chart in FIG. 8, a filter thickness of the G filter formed in the first pixel region R1 and a filter thickness of the G filter formed in the second pixel region R2 are the same. At this point of time, no difference in filter thickness in the present embodiment occurs also in comparison with the conventional example (see the "after G filter formation" section in the "conventional example" section in the chart in FIG. 8).

Subsequently, an Rr pigment-contained photosensitive resin (photoresist) is applied to the entire surfaces of the pixel sections 21 (step S4).

Then, a photomask for an Rr filter is put on the pixel sections 21 and the pixel sections 21 are subjected to an exposure for applying light such as an ultraviolet ray to transfer a pattern of the photomask to the pixel sections 21 (step S5).

Subsequently, the wafer is immersed in a developer for development to remove unnecessary photoresist parts and then is washed with pure water, and a filter pattern including an Rr filter in addition to the G filter is thus formed (step S6).

In the conventional example, a ratio of the number of pixels on which a G filter is formed in a phase difference pixel arrangement region is large in comparison with the number of pixels on which the G filter is formed in a normal region. Thus, in the phase difference pixel arrangement region, an Rr pigment-contained photoresist is more accumulated on pixels on which the G filter is not formed, than in the normal region, and thus, a filter thickness of an Rr filter formed in the phase difference pixel arrangement region becomes, for example, larger than a filter thickness of the Rr filter formed in the normal region (see the "after Rr filter formation" section in the "conventional example" section in the chart in FIG. 8).

On the other hand, in the case of the present embodiment, a ratio in number of pixels on which the G filter is formed in the first pixel region R1 and a ratio in number of pixels on which the G filter is formed in the second pixel region R2 are the same. Thus, as indicated in the "after Rr filter formation" section in the "present embodiment" section in the chart in FIG. 8, filter thicknesses of the Rr filter formed in the first pixel region R1 and the second pixel region R2 are the same. (Here, the film thickness of the Rr filter is different from the filter thickness of the G filter, which is, however, a general trend and thus not problematic. Also, the filter thickness can be adjusted by adjusting an amount of the photosensitive resin to be applied.)

Furthermore, a Bb pigment-contained photosensitive resin (photoresist) is applied to the entire surfaces of the pixel sections 21 (step S7).

Then, a photomask for a Bb filter is put on the pixel sections 21 and the pixel sections 21 are subjected to an exposure for applying light such as an ultraviolet ray to transfer a pattern of the photomask to the pixel sections 21 (step S8).

Subsequently, the wafer is immersed in a developer for development to remove unnecessary photoresist parts, and then is washed with pure water, and a filter pattern including the G filter, the Rr filter and a Bb filter is thus formed (step S9).

At this time, also as in the case of the Rr filter, while in the conventional example, a filter thickness of a Bb filter formed in the phase difference pixel arrangement region becomes, for example, larger than a filter thickness of the Bb filter formed in the normal region, in the case of the present embodiment, filter thicknesses of the Bb filter formed in the first pixel region R1 and the second pixel region R2 are the same (see the "after Bb filter formation" section in each of the "present embodiment" section and the "conventional example" section in the chart in FIG. 8).

Upon end of the processing in step S9 as described above, the process for manufacturing the image pickup device 2 transitions from the on-chip color filter manufacturing process to a subsequent process, such as an on-chip microlens manufacturing process.

Figure 9:
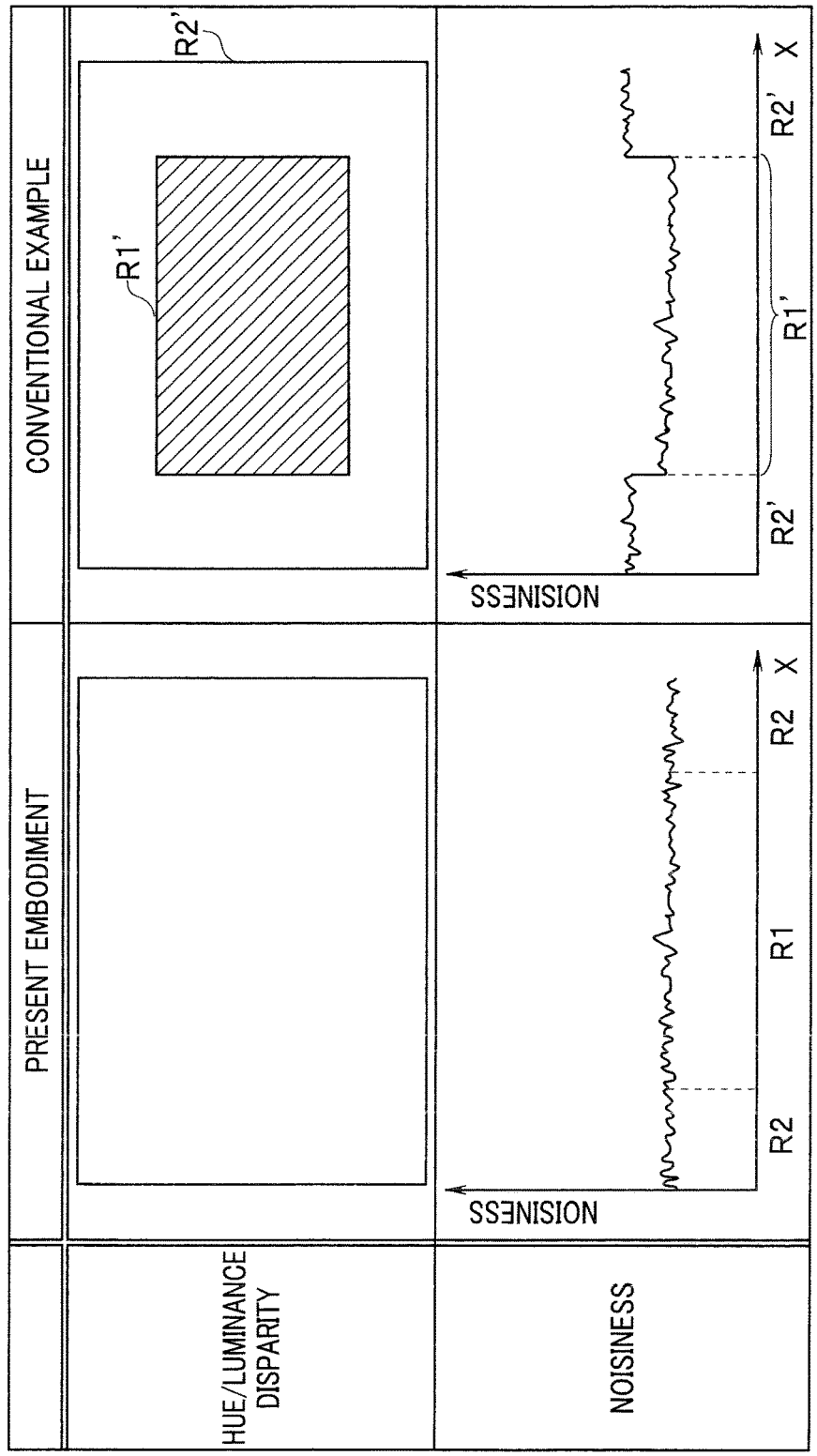
FIG. 9 is a chart illustrating an improvement in hue/luminance disparity and an improvement in noisiness in Embodiment 1 in comparison with the conventional example.

FIG. 9 is a chart illustrating an improvement in hue/luminance disparity and an improvement in noisiness in comparison with the conventional example.

As mentioned above, in the conventional example, in the phase difference pixel arrangement region (indicated by reference numeral R1' in the "hue/luminance disparity" section in FIG. 9), the thicknesses of the Rr filter and the Bb filter are, for example, large in comparison with the normal region (indicated by reference numeral R2' in the "hue/luminance disparity" section in FIG. 9), and thus, in the phase difference pixel arrangement region, the luminance is somewhat decreased relative to the normal region and, for example, a greenish hue is provided. On the other hand, in the present embodiment, no difference in filter thickness of each color filter occurs between the first pixel region R1 and the second pixel region R2, and thus, as opposed to the conventional example, no disparity occurs in hue and luminance.

Also, in the conventional example, a pixel value of each phase difference pixel in the phase difference pixel arrangement region is interpolated based on pixel values of image pixels adjacent to the phase difference pixel, but the interpolation processing is performed by arithmetic averaging such as weighted averaging according to characteristics of a shot image and thus corresponds to flattening processing, and therefore, as indicated in the "noisiness" section in the "conventional example" section in FIG. 9, a noise amount of random noise such as represented by dark-current noise is smaller in the phase difference pixel arrangement region R1' than in the normal region R2', that is, the normal region R2' and the phase difference pixel arrangement region R1' are different from each other in noisiness.

On the other hand, in the present embodiment, for each of pixels at positions in the second pixel region R2, the positions corresponding to positions at which phase difference pixels are arranged in the first pixel region R1, interpolation processing is performed as in the first pixel region R1, regardless of whether the pixel is a phase difference pixel or an image pixel. Consequently, as indicated in the "noisiness" section in the "present embodiment" section in FIG. 9, the first pixel region R1 and the second pixel region R2 can be made to be equivalent to each other in terms of a level of noisiness. Furthermore, same interpolation processing can be employed for the first pixel region R1 and the second pixel region R2 with no distinction, and thus, the processing is simple.

Also, reading from the image pickup device 2, besides reading of all pixels for a still image, as mentioned above, mix reading, which is pixel-addition reading for a movie or a live view image is performed. More specifically, the mix processing is processing for arithmetic averaging of pixel values of a plurality of pixels.

In the present embodiment, mix reading is performed according to rules (1) to (4) below.
(1) Phase difference pixels arranged at regular positions in the first pixel region R1 are included in mix processing.
(2) Phase difference pixels arranged at irregular positions in the first pixel region R1 are not included in the mix processing.
(3) Rule (1) and rule (2) are applied to each of pixels at the positions in the second pixel region R2, the positions corresponding to the phase difference pixels in the first pixel region R1, regardless of whether the pixel is a phase difference pixel or an image pixel. Note that, if the pixel section 21 includes an OB region, rule (1) and rule (2) are applied also to the OB region.
(4) If mix processing is performed for digital signals, division from among respective arithmetic operations, addition, subtraction, multiplication and division when arithmetic averaging is performed is performed last of the respective arithmetic operations, that is, rounding-off to a nearest whole number accompanying the division is performed last of the respective arithmetic operations.

Here, not only phase difference pixel signals acquired from phase difference pixels arranged at regular positions are luminance-equivalent signals containing a large amount of luminance components, but also other image pixel signals for which phase difference pixel signals at regular positions are subjected to mix processing are luminance-equivalent signals. On the other hand, although phase difference pixel signals acquired from phase difference pixels arranged at irregular positions are luminance-equivalent signals, other image pixel signals for which phase difference pixel signals at irregular positions are subjected to mix processing are color difference-equivalent signals containing a large amount of color difference components.

Therefore, if phase difference pixel signals at regular positions are subjected to mix processing, the mix processing is mix processing of luminance-equivalent signals, but if phase difference pixel signals at irregular positions are subjected to mix processing, the mix processing is mix processing of luminance-equivalent signals and color difference-equivalent signals.

Furthermore, in general, for Bb pixel and Rr pixel information mainly serving as color difference information, a difference cannot be recognized well enough by human eyes even if an amount of information in a space is small, in comparison with Gr and Gb information mainly serving as luminance information.

Therefore, (1) is applied to the phase difference pixel signals at the regular positions, and (2) is applied to the phase difference pixel signals at the irregular positions.

More specifically, according to rule (1) described above, if phase difference pixels (phase difference pixels R and L in the example in FIG. 5) arranged at positions corresponding to the Gr pixel in the predetermined arrangement pattern P0 are included at positions of pixels that are objects of mix processing, the phase difference pixels are included in the mix processing.

Also, according to rule (2) above, if phase difference pixels (phase difference pixels T and B in the example in FIG. 5) arranged at positions corresponding to the Bb pixel in the predetermined arrangement pattern P0 are included in positions of pixels that are objects of mix processing, the phase difference pixels are not included in the mix processing.

Furthermore, rule (3) above is intended to prevent occurrence of a disparity in noisiness such as described with reference to FIG. 9 between the first pixel region R1 and the second pixel region R2 also in an image resulting from mix processing, by means of employment of similar processing for pixel positions corresponding to each other. Here, if pixels in the second pixel region R2, the pixels being arrange at positions corresponding to phase difference pixels at irregular positions in the first pixel region R1, are image pixels, in the conventional example, the pixel signals are included in mix processing. Therefore, application of rule (2) to the image pixels in the second pixel region R2 is processing that is novel in comparison with the conventional example.

Then, the application of rule (3) eliminates a need to perform different types of mix processing for the first pixel region R1 and the second pixel region R2 (also for the OB region), and thus, a need to, e.g., determine whether pixels that are objects of mix processing are included in the first pixel region R1 or the second pixel region R2 (or the OB region) and make the processing branch based on a result of the determination is eliminated, enabling simplification of the processing.

Figure 10:
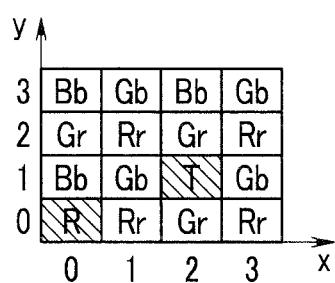
FIG. 10 is a diagram for describing mixed pixel signals outputted from the first pixel region as a result of mix processing in Embodiment 1.

Here, an example of application of rule (1) and rule (2) will be described with reference to FIG. 10. FIG. 10 is a diagram for describing mixed pixel signals outputted from the first pixel region R1 as a result of mix processing. Here, a relative address in an x direction and a y direction of a pixel is expressed by (x, y).

From pixel signals Gr_mix, Rr_mix, Gb_mix and Bb_mix when V2/2H2/2 mix reading in which addition of two pixels in two pixels in a horizontal direction and two pixels in two pixels in a vertical direction of pixels including a same type of filter is performed from pixel signals in the pixel array illustrated in FIG. 10 can be obtained as indicated by Equations 1 to 4 below.

$$Gr\_mix=\{R(0,0)+Gr(2,0)+Gr(0,2)+Gr(2,2)\}/4 \quad \text{[Equation 1]}$$

$$Rr\_mix=\{Rr(1,0)+Rr(3,0)+Rr(1,2)+Rr(3,2)\}/4 \quad \text{[Equation 2]}$$

$$Gb\_mix=\{Gb(1,1)+Gb(3,1)+Gb(1,3)+Gb(3,3)\}/4 \quad \text{[Equation 3]}$$

$$Bb\_mix=\{Bb(0,1)+Bb(0,3)+Bb(2,3)\}/3 \quad \text{[Equation 4]}$$

In other words, as indicated in Equation 1, according to rule (1), R(0,0) corresponding to a position of Gr(0,0) is included in mix processing. As described above, the pixel-mixed reading circuit mixes a phase difference pixel signal from a phase difference pixel arranged at a regular position in the first pixel region R1 and image pixel signals from image pixels on which the first type of filter (G filter as a specific example) is formed, the image pixels being adjacent to the phase difference pixel, and generate a mixed pixel signal.

Here, as described above, each phase difference pixel includes an opening, a part of which is light-shielded by a light-shielding portion SH, and thus, the area of the opening of the opening portion OP is smaller than the area of the opening of an image pixel, and thus, a signal value of a phase difference pixel signal is smaller than a signal value of an image pixel signal. Therefore, a pixel value of a mixed pixel signal including a phase difference pixel signal is smaller than a pixel value of a mixed pixel signal including no phase difference pixel signal. Furthermore, where light from an object that is out of focus enters phase difference pixels, a geometric pattern may be generated based on a difference between the phase difference pixels and image pixels. Therefore, such pixel value decrease and geometric pattern generation are corrected by, for example, known correction processing being performed by the image processing section 3.

Also, as indicated in Equation 4, according to rule (2), G(2,1) corresponding to a position of Bb(2,1) is excluded from mix processing. In this way, the pixel-mixed reading circuit generates a mixed pixel signal without including a phase difference pixel signal of a phase difference pixel arranged at an irregular position in the first pixel region R1.

Figure 11:
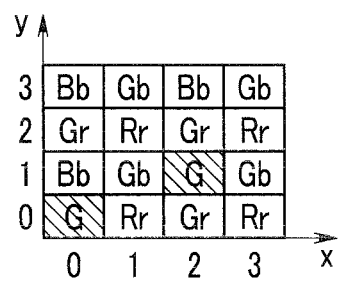
FIG. 11 is a diagram for describing mixed pixel signals outputted from the second pixel region as a result of mix processing in Embodiment 1.

Next, an example of application of rule (3) will be described with reference to FIG. 11. FIG. 11 is a diagram for describing mixed pixel signals outputted from the second pixel region R2 as a result of mix processing.

As in the above, pixel signals Gr_mix, Rr_mix, Gb_mix and Bb_mix when V2/2H2/2 mix reading is performed for pixels including a same type of filter can be obtained as indicated in Equations 5 to 8 below.

$$Gr\_mix=\{G(0,0)+Gr(2,0)+Gr(0,2)+Gr(2,2)\}/4 \quad \text{[Equation 5]}$$

$$Rr\_mix=\{Rr(1,0)+Rr(3,0)+Rr(1,2)+Rr(3,2)\}/4 \quad \text{[Equation 6]}$$

$$Gb\_mix=\{Gb(1,1)+Gb(3,1)+Gb(1,3)+Gb(3,3)\}/4 \quad \text{[Equation 7]}$$

$$Bb\_mix=\{Bb(0,1)+Bb(0,3)+Bb(2,3)\}/3 \quad \text{[Equation 8]}$$

In other words, as indicated in Equation 5, according to rule (1) applied based on rule (3), G(0,0) corresponding to a position of Gr(0,0) is included in mix processing.

Also, as indicated in Equation 8, according to rule (2) applied based on rule (3), G(2,1) corresponding to a position of Bb(2,1) is excluded from mix processing. In this way, the pixel-mixed reading circuit generates a mixed pixel signal without including a pixel signal of a pixel arranged at an irregular position in the second pixel region R2.

Next, rule (4) is a rule for minimizing an arithmetic operation error within a range of a given bit precision when digital signals are subjected to mix processing. Therefore, it is unnecessary to take rule (4) into consideration when mix processing is performed at the stage of analog signals.

First, it is assumed that where pixel values are values resulting from 10-bit A/D conversion and an arithmetic operation related to a division in mix processing (more specifically, arithmetic operations such as ×(⅓), ×(¼) and ×(⅕) are generated in arithmetic averaging) is performed, an operational precision of decimals equivalent to 12 bits is secured.

More specifically, in 12-bit decimal expression, ⅓ is $1365/4096=0.333252$, ¼ is $1024/4096=0.25$, and ⅕ is $819/4096=0.199951$.

Example 1

An average of three pixels where pixel values of the three pixels are 389, 254 and 162 is calculated as follows.

Three pixel average=(389+254+162)×$1365/4096$=805× 0.333252=268

Example 2

An average of four pixels where pixel values of the four pixels are 389, 254, 162 and 92 is calculated as follows.

Four pixel average=(389+254+162+92)× $1024/4096$=897×0.25=224

Example 3

An average of five pixels where pixel values of the five pixels are 389, 254, 162, 92 and 111 is calculated as follows.

Five pixel average=(389+254+162+92+111)× $819/4096$=1008×0.199951=202

In each of examples 1 to 3, rounding-off to a nearest integer number is performed last of the entire arithmetic operations including the other arithmetic operations. Such processing procedure is desirable from the perspective of arithmetic operation error minimization.

Employment of the arithmetic operation method according to rule (4) enables obtaining arithmetic operation results with necessary precision with no need for high arithmetic operation bit precision or with no high arithmetic operation function.

Here, although a pixel signal (mixed pixel signal) after mix processing is calculated as an average of four pixels in each of Equations 1 to 3 and 5 to 7, a pixel signal is calculated as an average of three pixels in each of Equations 4 and 8. Since Equation 4 and Equation 8 are the same arithmetic equation, only Equation 4 is considered: Equation 4 can be rewritten as Equation 4' below.

$Bb\_mix=[\{Bb(0,1)+Bb(0,3)+Bb(2,3)\}/4]×(4/3)$ [Equation 4']

Equation 4' above can be read as the pixel-mixed reading circuit performing 4/3-power gain-up of a mixed pixel signal resulting from normal mix processing and correcting the resulting signal because if pixel values are added and the resulting value is divided by four as in normal mix processing, the signal value decreases because of lack of a pixel signal for one pixel.

In this way, the pixel-mixed reading circuit performs gain-up of a mixed pixel signal generated without including a pixel signal of a pixel arranged at an irregular position so as to supplement a decrease in signal value of the mixed pixel signal.

Also, Equation 4 can be rewritten as Equation 4" below.

$Bb\_mix=[Bb(0,1)+\{Bb(0,1)+Bb(0,3)+Bb(2,3)\}/12+Bb(0,3)+Bb(2,3)]/4$ [Equation 4"]

Equation 4" above can be read as the pixel-mixed reading circuit interpolating a pixel value at a position of Bb(2,1), which is lacking, to generate an interpolated pixel signal of $\{Bb(0,1)+Bb(0,3)+Bb(2,3)\}/12$ and thus generate a mixed pixel signal including the interpolated pixel signal.

In this way, the pixel-mixed reading circuit generates an interpolated pixel signal at an irregular position where the predetermined arrangement pattern P0 is employed, based on image pixel signals of image pixels on which a type of filter for the irregular position is formed, the image pixels being adjacent to the irregular position, and generates a mixed pixel signal including the interpolated pixel signal.

Here, the present invention is not limited to the case where an interpolated pixel signal generated using the method indicated in Equation 4" is used for generation of a mixed pixel signal, and it should be understood that, for example, an interpolated pixel signal generated using pixel values of Bb pixels provided in a further peripheral portion may be used for generation of a mixed pixel signal. As described above, the method for generating an interpolated pixel signal to be used for generation of a mixed pixel signal is not limited to a particular method.

Figure 12:
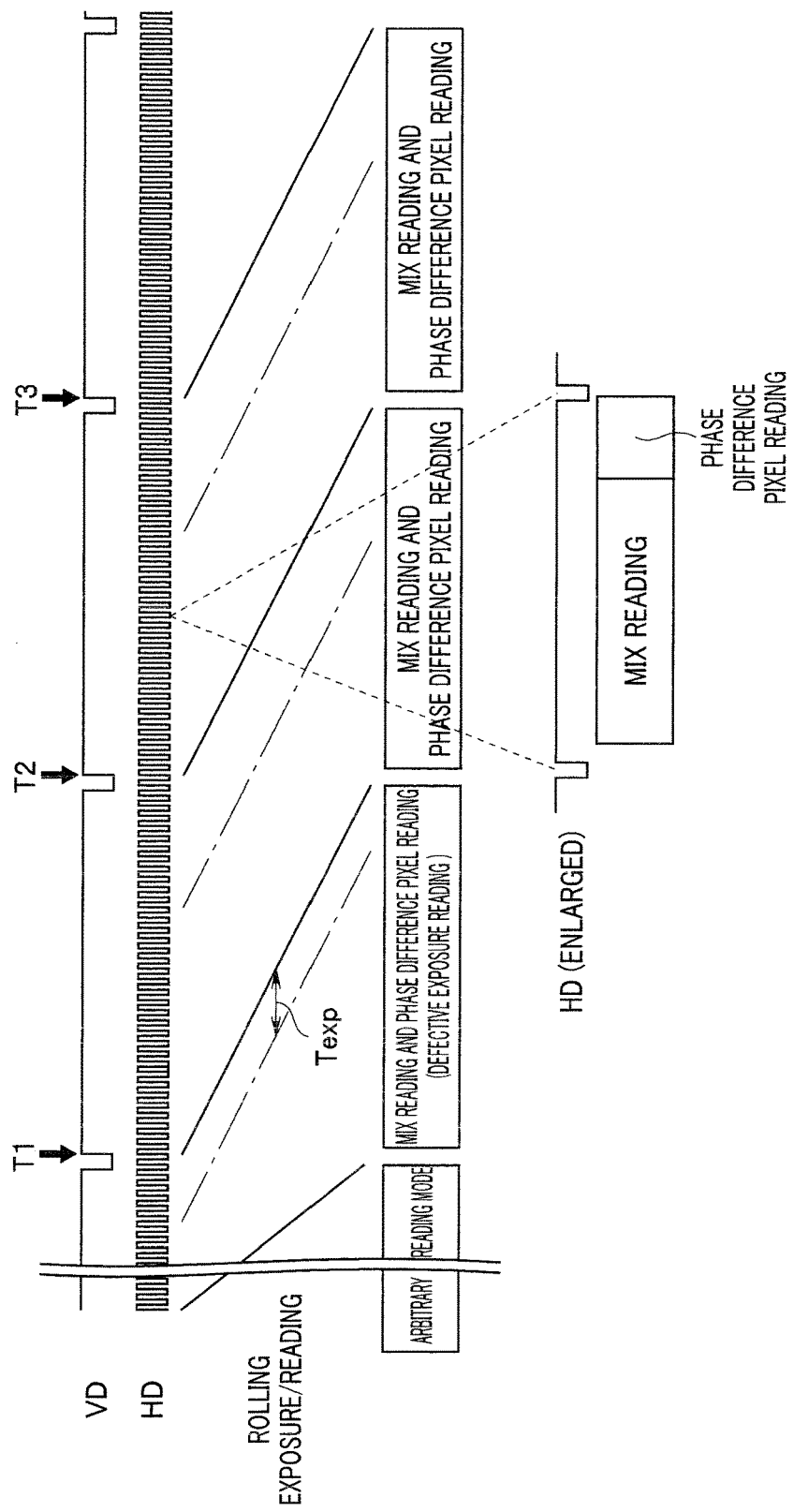
FIG. 12 is a timing chart for describing statues of output signals when pixel-mixed reading is performed in Embodiment 1.

Next, FIG. 12 is a timing chart indicating statuses of output signals when pixel-mixed reading is performed. Note that FIG. 12 indicates an example where rolling exposure and rolling reading are performed.

When the image pickup device 2 is operating in an arbitrary reading mode, upon provision of an instruction to change the reading mode to a mix reading mode by, e.g. operation of the camera operation section 11, a change to the mix reading mode is set from the exposure control section 9 to the image pickup device 2 at a timing T1 synchronized with the vertical synchronization signal VD, under the control of the camera control section 12. Likewise, subsequent timings T2, T3 and onwards synchronized with the vertical synchronization signal VD are timings for changing sensitivity setting and shutter speed setting.

Here, rolling exposure is started at a point of time backed by an exposure time period Texp from a rise timing of the vertical synchronization signal VD, sequentially, for example, from an upper end line to a lower end line. Therefore, at the point of the timing T1 at which the reading mode is set to the mix reading mode, exposure is already started for a part of the pixels, and a frame that is being subjected to exposure at the time of the mode change is a defective frame and thus is not used for generation of a frame image.

Then, image data in the mix reading mode is outputted from a frame next to the defective frame. In rolling reading, pixel signals are read on a line-by-line basis in synchronization with the horizontal synchronization signal HD. In the bottom of FIG. 12, a pixel signal outputted for one HD is illustrated.

As illustrated in the bottom of FIG. 12, in reading of one line, first, mixed pixel signals resulting from mix processing are sequentially read from the first pixel region R1 and the second pixel region R2, and after all of the mixed pixel signals for one line being read, phase difference pixel signals are read from phase difference pixels positioned on the relevant line in the first pixel region R1. As described above, no valid phase difference pixel signals are outputted from the second pixel region R2, and thus, phase difference pixel signals are read only from the first pixel region R1.

In this way, the pixel-mixed reading circuit reads mixed pixel signals from the first pixel region R1 and the second pixel region R2, and reads phase difference pixel signals only from the first pixel region R1.

According to Embodiment 1 described above, phase difference pixels are arranged not only at regular positions but also at irregular positions in the first pixel region R1, and a density in arrangement of phase difference pixels is thus increased, enabling enhancement in focus detection precision. Then, in comparison with the case where phase difference pixels are arranged only at regular positions, a decrease in number of image pixels on which a first type of filter (for example, a G filter) is formed is prevented, enabling suppression of decrease in resolution of an entire image.

Furthermore, the basic arrangement pattern P2 of filters in the second pixel region R2 is made to be equal to the basic arrangement pattern P1 of filters in the first pixel region R1, and thus, a color balance difference between the first pixel region including phase difference pixels and the second pixel region including no pixel configured to output a valid phase difference pixel signal can be reduced.

Also, since mixed pixel signals are read from the first pixel region R1 and the second pixel region R2 and phase difference pixel signals are read only from the first pixel region R1, mix reading is enabled and reading of invalid phase difference pixel signals from the second pixel region R2 when mix reading is performed can be omitted.

Then, if the configuration is made so that the second pixel region R2 includes no phase difference pixel, image pixel signals can be acquired from pixel positions in the second pixel region R2, the pixel positions corresponding to positions of phase difference pixels in the first pixel region R1.

In addition, the configuration is made so as to include the phase difference pixels for vertical line detection and the phase difference pixels for horizontal line detection, focus detection can be performed regardless of whether an object pattern is horizontal or vertical. At this time, one of the phase difference pixels for vertical line detection and the phase difference pixels for horizontal line detection are all arranged at regular positions and the other of the phase difference pixels for the vertical line detection and the phase difference pixels for the horizontal line detection are all arranged at irregular positions, and thus, a decrease of image pixel signals from pixels on which the first type of filter (for example, the G filter) is arranged can be suppressed, and consequently a decrease in resolution of an image can be suppressed.

Also, since a mixed pixel signal is generated by mixing a phase difference pixel signal of a phase difference pixel arranged at a regular position in the first pixel region R1 and image pixel signals of image pixels on which the first type of filter is formed, the image pixels being adjacent to the phase difference pixel, a mixed pixel signal using a phase difference pixel signal including a luminance-equivalent component can be obtained, enabling enhancement in resolution of an image.

Furthermore, mixed pixel signals are generated without including phase difference pixel signals from phase difference pixels arranged at irregular positions in the first pixel region R1, and thus, generation of a geometric pattern when light from an object that is out of focus enters the phase difference pixels can be suppressed.

Likewise, mixed pixel signals are generated without including pixel signals of pixels arranged at irregular positions in the second pixel region R2, and thus, generation of a geometric pattern can be suppressed also in the second pixel region R2 as in the first pixel region R1.

Then, an interpolated pixel signal for an irregular position where the predetermined arrangement pattern P0 is employed is generated based on image pixel signals of image pixels on which a type of filter corresponding to the irregular position is formed, the image pixels being adjacent to the irregular position, and a mixed pixel signal is generated so as to include the interpolated pixel signal, enabling suppression in decrease in pixel value of the mixed pixel signal.

On the other hand, gain-up of a mixed pixel signal generated without including a pixel signal of a pixel arranged at an irregular position so as to supplement a decrease in signal value of the mixed pixel signal enables suppression in decrease in pixel value of the mixed pixel signal.

Also, where the second pixel region R2 is configured so as to include a plurality of phase difference pixels each configured to generate an invalid phase difference pixel signal in addition to a plurality of image pixels, the image pickup device 2 can be manufactured with no distinction between the first pixel region R1 and the second pixel region R2.

Then, even if phase difference pixels each configured to generate and output an invalid phase difference pixel signal are included in the second pixel region R2, the focus detection signal processing circuit including, e.g., the AF evaluation value arithmetic operation section 4, the camera control section 12 and the focus control section 10 performs focus detection using phase difference pixel signals only from the first pixel region R1, without using invalid phase difference pixel signals from the second pixel region R2, and thus, accurate focus detection with less error.

Note that each of the sections described above may be configured as a circuit. Then, an arbitrary circuit may be installed as a single circuit or as a combination of a plurality of circuits as long as the circuit can perform a same function. Furthermore, an arbitrary circuit is not limited to a dedicated circuit for performing an intended function, and may be configured to perform an intended function by means of causing a general-purpose circuit to execute a processing program.

As mentioned above, mainly an image pickup device and an image pickup apparatus have been as an example to which the present invention is applied. However, examples to which the present invention is applied are not limited to this, and they may be, e.g., an operation method for causing an image pickup device or an image pickup apparatus to operate in such a manner as described above, a processing program for causing a computer to perform processing that is similar to processing in the image pickup apparatus or the like, a processing program for causing a computer to control an image pickup device or a computer-readable, non-temporary recording medium that records the processing program.

Having described the preferred embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. An image pickup device including a plurality of pixels arranged in two dimensions, one type of filter from among plural types of filters having different spectral characteristics being formed on each of the plurality of pixels, the image pickup device comprising:
 a first pixel region including a plurality of image pixels each configured to generate and output an image pixel signal, and a plurality of phase difference pixels each configured to generate and output a phase difference pixel signal; and a second pixel region including a plurality of image pixels each configured to generate and output an image pixel signal and including no pixel configured to output a valid phase difference pixel signal, wherein the plural types of filters are arranged on the plurality of image pixels in the first pixel region according to a predetermined arrangement pattern, for the plurality of phase difference pixels, a first type of filter from among the plural types of filters is formed on each of the phase difference pixels, and a part of the plurality of phase difference pixels is arranged at a regular position that is a position at which the first type of filter is formed where the predetermined arrangement pattern is applied to positions of the phase difference pixels and another part of the plurality of phase difference pixels is arranged at an irregular position that is a position at which a type of filter that is different from the first type of filter is formed, and a basic arrangement pattern of filters in the second pixel region is equal to a basic arrangement pattern of filters in the first pixel region.

2. The image pickup device according to claim 1, further comprising:

a pixel-mixed reading circuit configured to generate and read a mixed pixel signal resulting from mixing of pixel signals of a plurality of adjacent pixels on which a same type of filter is formed, wherein the pixel-mixed reading circuit reads the mixed pixel signal from the first pixel region and the second pixel region, and reads the phase difference pixel signal only from the first pixel region.

3. The image pickup device according to claim 2, wherein the pixel-mixed reading circuit generates the mixed pixel signal by mixing a phase difference pixel signal of a phase difference pixel arranged at the regular position in the first pixel region and image pixel signals of image pixels on which the first type of filter is formed, the image pixels being adjacent to the phase difference pixel.

4. The image pickup device according to claim 2, wherein the pixel-mixed reading circuit generates the mixed pixel signal without including a phase difference pixel signal of a phase difference pixel arranged at the irregular position in the first pixel region.

5. The image pickup device according to claim 4, wherein the pixel-mixed reading circuit generates the mixed pixel signal without including a pixel signal of a pixel arranged at the irregular position in the second pixel region.

6. The image pickup device according to claim 5, wherein the pixel-mixed reading circuit generates an interpolated pixel signal for the irregular position based on image pixel signals of image pixels on which a type of filter for the irregular position where the predetermined arrangement pattern is employed is formed, the image pixels being adjacent to the irregular position, and generates the mixed pixel signal so as to include the interpolated pixel signal.

7. The image pickup device according to claim 5, wherein the pixel-mixed reading circuit performs gain-up of the mixed pixel signal so as to supplement a decrease in signal value of the mixed pixel signal generated without including the pixel signal of the pixel arranged at the irregular position.

8. The image pickup device according to claim 4, wherein the pixel-mixed reading circuit generates an interpolated pixel signal for the irregular position based on image pixel signals of image pixels on which a type of filter for the irregular position where the predetermined arrangement pattern is employed is formed, the image pixels being adjacent to the irregular position, and generates the mixed pixel signal so as to include the interpolated pixel signal.

9. The image pickup device according to claim 4, wherein the pixel-mixed reading circuit performs gain-up of the mixed pixel signal so as to supplement a decrease in a signal value of the mixed pixel signal generated without including the pixel signal of the pixel arranged at the irregular position.

10. The image pickup device according to claim 2, wherein the second pixel region includes the plurality of image pixels, and further includes a plurality of phase difference pixels each configured to generate an invalid phase difference pixel signal.

11. The image pickup device according to claim 2, wherein the second pixel region does not include the phase difference pixels.

12. The image pickup device according to claim 2, wherein:

the phase difference pixels include phase difference pixels for vertical line detection, a right side or a left side of each pixel being light-shielded, and phase difference pixels for horizontal line detection, a top side or a bottom side of each pixel being light-shielded; and one of the phase difference pixels for the vertical line detection and the phase difference pixels for the horizontal line detection are all arranged at the regular positions and another of the phase difference pixels for the vertical line detection and the phase difference pixels for the horizontal line detection are all arranged at the irregular positions.

13. The image pickup device according to claim 1, wherein the second pixel region does not include the phase difference pixels.

14. The image pickup device according to claim 1, wherein:

the phase difference pixels include phase difference pixels for vertical line detection, a right side or a left side of each pixel being light-shielded, and phase difference pixels for horizontal line detection, a top side or a bottom side of each pixel being light-shielded; and one of the phase difference pixels for the vertical line detection and the phase difference pixels for the horizontal line detection are all arranged at the regular positions and another of the phase difference pixels for the vertical line detection and the phase difference pixels for the horizontal line detection are all arranged at the irregular positions.

15. An image pickup apparatus comprising:

an image pickup device according to claim 1; and a focus detection signal processing circuit configured to perform focus detection based on the phase difference pixel signals outputted from the image pickup device, wherein the second pixel region in the image pickup device includes the plurality of image pixels, and further includes a plurality of phase difference pixels each configured to generate and output an invalid phase difference pixel signal, and the focus detection signal processing circuit performs focus detection using only the phase difference pixel signals from the first pixel region, without using the invalid phase difference pixel signals from the second pixel region.

* * * * *